United States Patent [19]

Ito

[11] Patent Number: 5,321,652
[45] Date of Patent: Jun. 14, 1994

[54] MICROCOMPUTER HAVING A DUAL PORT MEMORY OF SUPPLYING WRITE DATA DIRECTLY TO AN OUTPUT

[75] Inventor: Akira Ito, Kunitachi, Japan
[73] Assignee: Hitachi, Ltd., Tokyo, Japan
[21] Appl. No.: 859,865
[22] Filed: Mar. 30, 1992

Related U.S. Application Data

[60] Continuation of Ser. No. 575,481, Aug. 30, 1990, abandoned, which is a division of Ser. No. 259,731, Oct. 19, 1988, Pat. No. 5,197,035.

[30] Foreign Application Priority Data

Nov. 6, 1987 [JP] Japan .............................. 62-280750

[51] Int. Cl.[5] ..................... G11C 7/00; G11C 11/413
[52] U.S. Cl. ......................... 365/189.07; 365/189.04; 365/189.02; 365/230.05
[58] Field of Search .................. 365/189.04, 189.07, 365/189.02, 230.05, 230.06

[56] References Cited

U.S. PATENT DOCUMENTS

| | | | |
|---|---|---|---|
| 4,599,708 | 7/1986 | Schuster | 365/189.04 |
| 4,623,990 | 11/1986 | Allen et al. | 365/189.04 |
| 4,811,296 | 3/1989 | Garde | 365/189.07 |
| 4,858,188 | 8/1989 | Kobayashi | 365/189.07 |

OTHER PUBLICATIONS

P. S. Bennett, et al., "High Performance BIMOS Gate Arrays with Embedded Configurable Static Memory", IEEE 1987 Custom Integrated Circuits Conference, pp. 195-198.

*Primary Examiner*—Glenn Gossage
*Attorney, Agent, or Firm*—Antonelli, Terry, Stout & Kraus

[57] ABSTRACT

A single chip microcomputer includes a multiport memory, such as a dual-port memory, having a data selector by which, when addresses which are input to first and second ports of the dual port memory are in agreement and the first and second ports are respectively set in a write mode and a read mode, write data supplied to the first port is directly transmitted as read data from the second port. The microcomputer also has an arithmetic logic unit which supplies the write data to the multiport memory and supplies the write data to selected memory cells in accordance with the selection being effected via an address decoder corresponding to the first port.

10 Claims, 6 Drawing Sheets

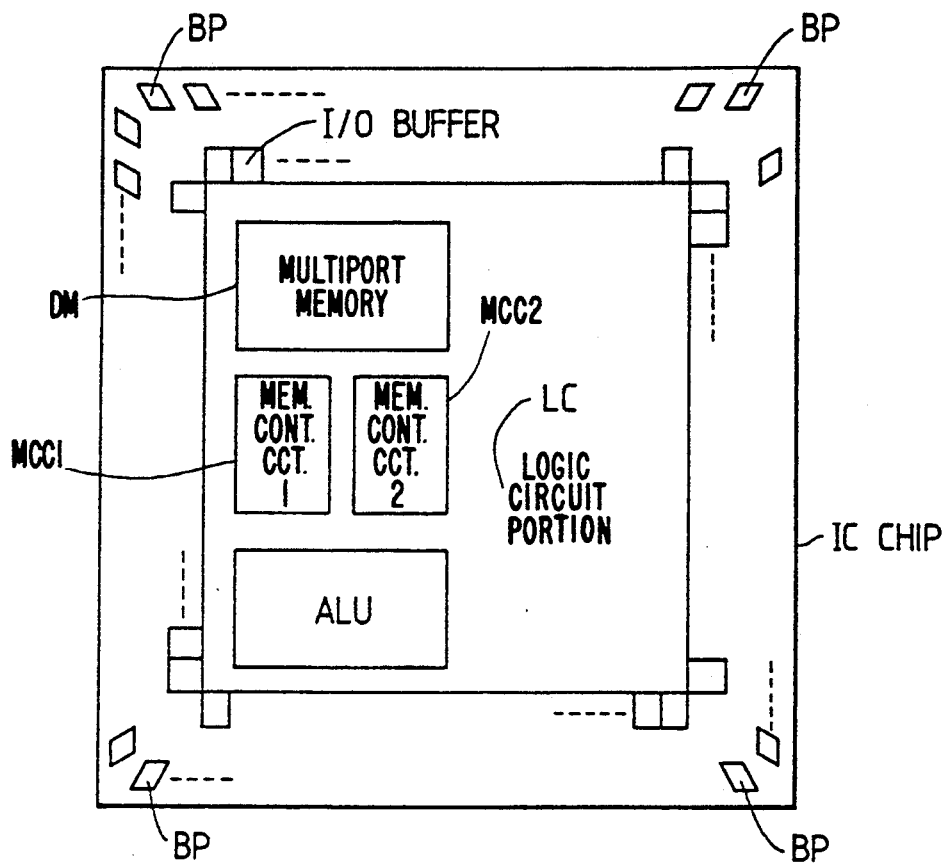
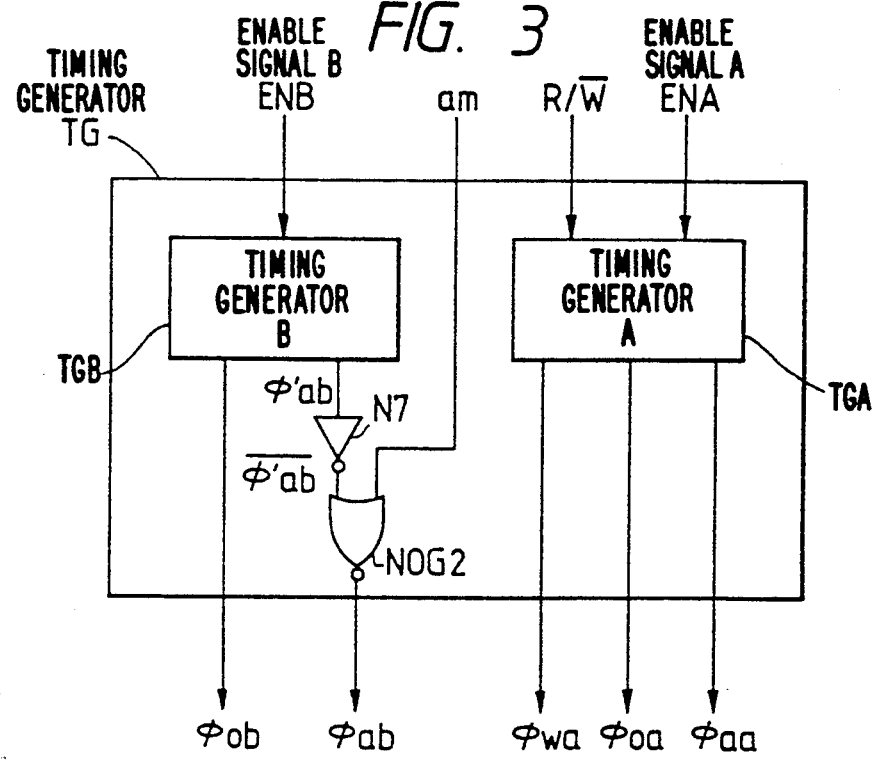

MICROCOMPUTER HAVING A DUAL PORT MEMORY OF SUPPLYING WRITE DATA DIRECTLY TO AN OUTPUT

This is a continuation of application Ser. No. 07/575,481, filed Aug. 30, 1990, now abandoned, which is a division of application Ser. No. 07/259,731, filed Oct. 19, 1988, now U.S. Pat. No. 5,197,035.

BACKGROUND OF THE INVENTION

The present invention relates to a semiconductor memory. By way of example, it relates to techniques which are effective when utilized for a multiport memory etc. built in a gate-array integrated circuit etc.

A gate-array integrated circuit has a built-in multiport memory. The multiport memory is employed as, for example, a register file when the gate-array integrated circuit constitutes, for example, a digital processor such as computer.

A multiport memory is described in, for example, IEEE 1987 CICC (Custom Integrated Circuits Conference), "High Performance BIMOS Gate Arrays With Embedded Configurable Static Memory" by P. S. Bennett et al, pp. 195-198.

In the multiport memory (dual-port memory) having two ports as stated in the above literature, there are times when addresses which are input to both ports are in agreement. When an operating condition arises, on occasion, during which both of the ports are set in a read mode a read operation at the agreeing address is executed without any change, and the resulting read data is output. In addition, when both ports are set in a write mode at this time, the write operation of one of the ports is inhibited so as to prevent an unspecified write condition from developing. Further, when one port is set in the write mode and the other port in the read mode, there is adopted a step wherein the read operation of the other port is inhibited or the read operation of the other port is carried out when the write operation of one port has ended.

In a case where the multiport memory is employed, for example, as the register file of a computer, one port is often used as a read-only port. Herein, in a case where the other port is set in the write mode and where the addresses which are input to both ports are in agreement, there is often adopted the aforementioned latter step wherein the read operation of one port is performed at the end of the write operation of the other port.

With such a step, however, the wait time involved of the port set in the read mode is undesirably lengthened, resulting in a correspondingly long access time of the multiport memory. For this reason, the operating speed of the computer or the like including the multiport memory is decreased thereby limiting the throughput capability thereof.

An object of the present invention is to provide a multiport memory from which the latest write data can be read at high speed even in a case where addresses which are input to at least two ports are in agreement and where one port is set in a write mode, while the other port is set in a read mode. Another object of the present invention is to further enhance the throughput capability of a digital processor including a multiport memory.

The above and other objects and novel features of the present invention will become apparent from the description of this specification and the accompanying drawings.

SUMMARY OF THE INVENTION

A typical aspect of performance of the present invention is briefly summarized as follows: A microcomputer including a multiport memory having a data selector by which, when addresses which are input to at least two ports agree and one port and the other port are respectively set in a write mode and a read mode, write data to be supplied from one port is directly transmitted as read data from the other port. That is, the write data from the one port is directly transmitted as read data from the other port via a data bus and a data selector. The data bus for directly transmitting write data, input to the one port, to the data selector to be directly outputted as read data from the other port acts as a bypass circuit of this multiport memory since the write data that is supplied from the one port is not transmitted to the memory cells of the memory array before being outputted.

According to the expedient stated above, even in the case where the addresses which are input to the plurality of ports agree and where one port is set in the write mode, while the other port is set in the read mode, the latest write data can be transmitted to the other port without passing it through a memory cell. Therefore, the period of time required for the read operation of the multiport memory in such a case can be shortened, and the overall access time of the multiport memory can be shortened. Furthermore, a digital processor including the multiport memory is permitted to raise its operating speed and can enhance its throughput capability.

BRIEF DESCRIPTION OF THE DRAWINGS

FIG. 1 is a plan view of an embodiment of a semiconductor substrate formed with a multiport memory to which the present invention is applied;

FIG. 3 is a diagram showing an example of the internal arrangement of a timing generator TG;

DESCRIPTION OF THE PREFERRED EMBODIMENTS

Shown in FIG. 1 is a plan view of an embodiment of a semiconductor substrate (IC CHIP) formed with a multiport memory to which the present invention is applied. Although not especially restricted, the multiport memory in this embodiment is built in a digital processor such as single-chip type microcomputer. Various circuit blocks constituting the digital processor are formed on the single semiconductor substrate made of single-crystal silicon by known techniques for manufacturing CMOS (complementary MOS) integrated circuits, though no special restriction is meant.

Referring to FIG. 1, a plurality of bonding pads BP are disposed in the peripheral region of the semiconductor substrate. These bonding pads BP are coupled to corresponding external terminals through pieces of bonding wire or the like. Some of the bonding pads BP are coupled to respective input/output circuits or I/O buffers which are formed at the end parts of the semiconductor substrate.

The input/output circuits I/O accept various input digital signals supplied from external devices, and transmit them to the corresponding internal circuits of the digital processor. In addition, the circuits I/O send various output digital signals delivered from the corresponding internal circuits of the digital processor, to the external devices.

In most of the semiconductor substrate, there is formed the logic circuit portion LC of the digital processor including an arithmetic-logic unit ALU, first and second memory control circuits MCC1 and MCC2 which decode address signals etc. from the arithmetic-logic unit ALU and supply the decoded signals to the multiport memory, and various control units. The multiport memory (DM) in this embodiment is formed at a predetermined position at a portion of the chip in which the logic circuit portion LC is formed. Although not especially limited thereto, the multiport memory is used as the register file of the digital processor.

Figure 6:
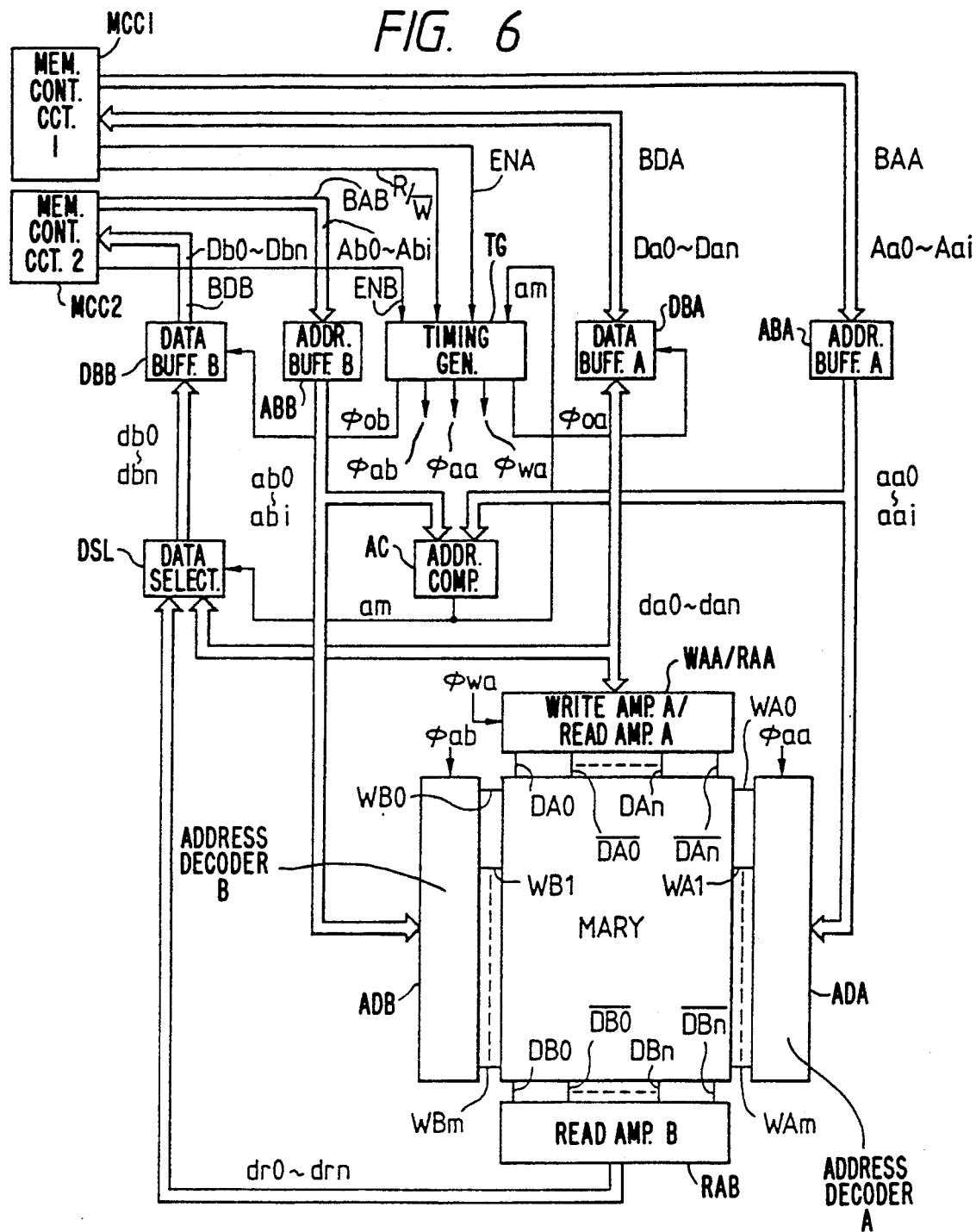
FIG. 6 is a block diagram showing an embodiment of the multiport memory to which the present invention is applied.

FIG. 6 is a block diagram showing an embodiment of the multiport memory to which the present invention is applied. Although it is not to be construed as being limited thereto, the multiport memory of this embodiment is built in a standard gate-array integrated circuit. The gate-array integrated circuit has some manufacturing masks formed optionally, thereby to facilitate construction of a digital processor, such as a computer, conforming to user specifications.

The multiport memory of this embodiment is coupled to the first memory control circuit MCC1 of the digital processor through an address bus BAA, a data bus BDA, and control buses such as an enable signal line ENA and a read/write signal line R/$\overline{\text{W}}$, while it is coupled to the second memory control circuit MCC2 of the digital processor through an address bus BAB, a data bus BDB, and a control bus such as an enable signal line ENB. Thus, the multiport memory of this embodiment functions as a dual-port memory which is accessible through the first and second memory control circuits MCC1 and MCC2 independently of each other. Although it is not restricted thereto, the port A of the dual-port memory coupled to the address bus BAA, etc. is constructed as an input/output port capable of both a write operation and a read operation, and the port B thereof coupled to the address bus BAB, etc. is constructed as a read-only port. The operation mode of the port A is designated by a read/write signal R/$\overline{\text{W}}$.

In the embodiment of FIG. 6, the multiport memory, although it is not particularly limited thereto, is basically constructed of a memory array MARY in which static memory cells are arranged in a matrix shape.

An address decoder ADA is supplied with address signals of $(i+1)$ bits aa0-aai from an address buffer ABA to be described later, and is also supplied with a timing signal $\phi$aa from a timing generator TG to be described later. Likewise, an address decoder ADB is supplied with address signals of $(i+1)$ bits ab0-abi from an address buffer ABB to be described later and is also supplied with a timing signal $\phi$ab from the timing generator TG.

The address decoder ADA is selectively brought into an operating state when the timing signal $\phi$aa is set at a high level. In the operating state, the address decoder ADA decodes the address signals aa0-aai supplied from the address buffer ABA and selectively brings the corresponding one of the word lines WA0-WAm of the memory array MARY into a selected state of high level. Likewise, the address decoder ADB is selectively brought into an operating state when the timing signal $\phi$ab is set at a high level. In the operating state, the address decoder ADB decodes the address signals ab0-abi and selectively brings the corresponding one of the word lines WB0-WBm of the memory array MARY into a selected state of high level.

The address buffer ABA accepts and holds address signals Aa0-Aai which are supplied through the address bus BAA from the first memory control circuit MCC1 of the digital processor. Then, the address buffer ABA supplies the address signals aa0-aai to the address decoder ADA and also supplies them to first input terminals of an address comparator AC, as will be described later. Likewise, the address buffer ABB accepts and holds address signals Ab0-Abi which are supplied through the address bus BAB from the second memory control circuit MCC2 of the digital processor. Then, the address buffer ABB supplies the address signals ab0-abi to the address decoder ADB and also supplies them to second input terminals of the address comparator AC.

The address comparator AC compares the address signals aa0-aai and ab0-abi which are respectively supplied from the address buffers ABA and ABB. When all the address signals supplied to the address comparator AC agrees, an address agreement detection signal am is rendered a high level. On the other hand, when the corresponding address signals supplied to the address comparator AC do not agree even at one bit, the address agreement detection signal am is rendered a low level.

The complementary data lines DA0, $\overline{\text{DA0}}$-DAn, $\overline{\text{DAn}}$ of the memory array MARY are respectively coupled to corresponding unit circuits of a write amplifier WAA and a read amplifier RAA. Likewise, the complementary data lines DB0, $\overline{\text{DB0}}$-DBn, $\overline{\text{DBn}}$ of the memory array MARY are respectively coupled to corresponding unit circuits of a read amplifier RAB.

Each of the write amplifier WAA and the read amplifier RAA includes $(n+1)$ unit circuits. The input terminals of the unit circuits of the write amplifier WAA are respectively coupled to the corresponding bits of a data buffer DBA, while the output terminals thereof are respectively coupled to the corresponding complementary data lines DA0, $\overline{\text{DA0}}$-DAn, $\overline{\text{DAn}}$ of the memory array MARY. The input terminals of the unit circuits of the read amplifier RAA are respectively coupled in common to the output terminals of the corresponding unit circuits of the write amplifier WAA, while the output terminals thereof are respectively coupled in common to the input terminals of the corresponding unit circuits of the write amplifier WAA. A timing signal $\phi$wa from the timing generator TG is supplied to all the unit circuits of the write amplifier WAA in common.

The respective unit circuits of the write amplifier WAA are selectively brought into operating states in such a way that the port A of the multiport memory is brought into a selected state as the write mode and that the timing signal $\phi$wa is set at a high level. In the operating states, the respective unit circuits of the write amplifier WAA form complementary write signals conforming to write data items da0–dan supplied from the data buffer DBA and transmit them to the corresponding complementary data lines DA0, $\overline{DA0}$–DAn, $\overline{DAn}$ of the memory array MARY. Thus, the write data items da0–dan are written into the (n+1) memory cells which are coupled to the selected one of the word lines WA0–WAm of the memory array MARY. The write data items da0–dan delivered from the data buffer DBA are also supplied to the input terminals of a data selector DSL on one side as will be described later.

When the port A of the multiport memory is brought into a selected state as the read mode, the respective unit circuits of the read amplifier RAA amplify read signals delivered through the corresponding complementary data lines DA0, $\overline{DA0}$–DAn, $\overline{DAn}$ from the (n+1) memory cells coupled to the selected one of the word lines WA0–WAm of the memory array MARY and transmit them to the data buffer DBA as read data da0–dan. The read data items da0–dan delivered from the read amplifier RAA are also supplied to the input terminals of the data selector DSL on one side.

Meanwhile, the read amplifier RAB similarly includes (n+1) unit circuits. The input terminals of these unit circuits are respectively coupled to the corresponding complementary data lines DB0, $\overline{DB0}$–DBn, $\overline{DBn}$ of the memory array MARY, while the output terminals thereof are respectively coupled to the input terminals of the data selector DSL at corresponding bits on the other side as will be described later.

When the port B of the multiport memory is brought into a selected state, the respective unit circuits of the read amplifier RAB amplify read signals delivered through the corresponding complementary data lines DB0, $\overline{DB0}$–DBn, $\overline{DBn}$ from the (n+1) memory cells coupled to the selected one of the word lines WB0–WBm of the memory array MARY and transmit them to the input terminals of the data selector DSL on the other side as read data dr0–drn.

When the address signals aa0–aai supplied from the address buffer ABA and the address signals ab0–abi supplied from the address buffer ABB do not agree even at one bit wherein the address agreement detection signal am is set at the low level, the data selector DSL selects the read data items dr0–drn supplied from the read amplifier RAB of the corresponding port B and transmits the read data to a data buffer DBB. In contrast, when the address signals aa0–aai and those ab0–abi agree at all the bits wherein the address agreement detection signal am is set at the high level, the data selector DSL operates as follows: In the case where the port A is set in the write mode, the data selector DSL selects the write data items da0–dan supplied from the data buffer DBA of the port A and transmits them to the data buffer DBB as read data db0–dbn. In the case where the port A is set in the read mode, the data selector DSL selects the read data items da0–dan supplied from the read amplifier RAA of the port A and transmits the read data to the data buffer DBB as the read data db0–dbn.

The data buffer DBA includes (n+1) data input buffers and data output buffers. Among them, the data input buffers have their input terminals respectively coupled to the corresponding bits of the data bus BDA and have their output terminals respectively coupled to the input terminals of the corresponding unit circuits of the write amplifier WAA, namely, the output terminals of the corresponding unit circuits of the read amplifier RAA.

On the other hand, the data output buffers of the data buffer DBA have their input terminals respectively coupled in common to the output terminals of the corresponding unit circuits of the read amplifier RAA, namely, the output terminals of the corresponding data input buffers and have their output terminals respectively coupled in common to the corresponding bits of the data bus BDA, namely, the input terminals of the corresponding data input buffers. All the data output buffers of the data buffer DBA are supplied in common with a timing signal $\phi$oa from the timing generator TG.

When the port A is brought into the selected state as the write mode, the data input buffers of the data buffer DBA transmit the write data items da0–dan as complementary write signals to the write amplifier WAA. When the port A is held in a non-selected state or is set in the read mode, the outputs of all the data input buffers of the data buffer DBA are held in high impedance states.

The data output buffers of the data buffer DBA are selectively brought into operating states in such a way that the port A is set in the selected state as the read mode and that the timing signal $\phi$oa is rendered a high level. In the operating states, the respective data output buffers transmit read data items Da0–Dan to the first memory control circuit MCC1 of the digital processor through the data bus BDA. When the timing signal $\phi$oa is held at a low level, the outputs of all the data output buffers of the data buffer DBA are held in high impedance states.

Likewise, the data buffer DBB includes (n+1) data output buffers. The input terminals of these data output buffers are respectively coupled to the output terminals of the corresponding inverter circuits N1–N3 of the data selector DSL to be described later, while the output terminals thereof are respectively coupled to the corresponding bits of the data bus BDB. All the data output buffers of the data buffer DBB are supplied in common with a timing signal $\phi$ob from the timing generator TG.

The data output buffers of the data buffer DBB are selectively brought into operating states in such a way that the port B is set in the selected state and that the timing signal $\phi$ob is rendered a high level. In the operating states, the respective data output buffers transmit read data items Db0–Dbn to the second memory control circuit MCC2 of the digital processor through the data bus BDB. When the timing signal $\phi$ob is held at a low level, the outputs of all the data output buffers of the data buffer DBB are held in high impedance states.

Figure 4:
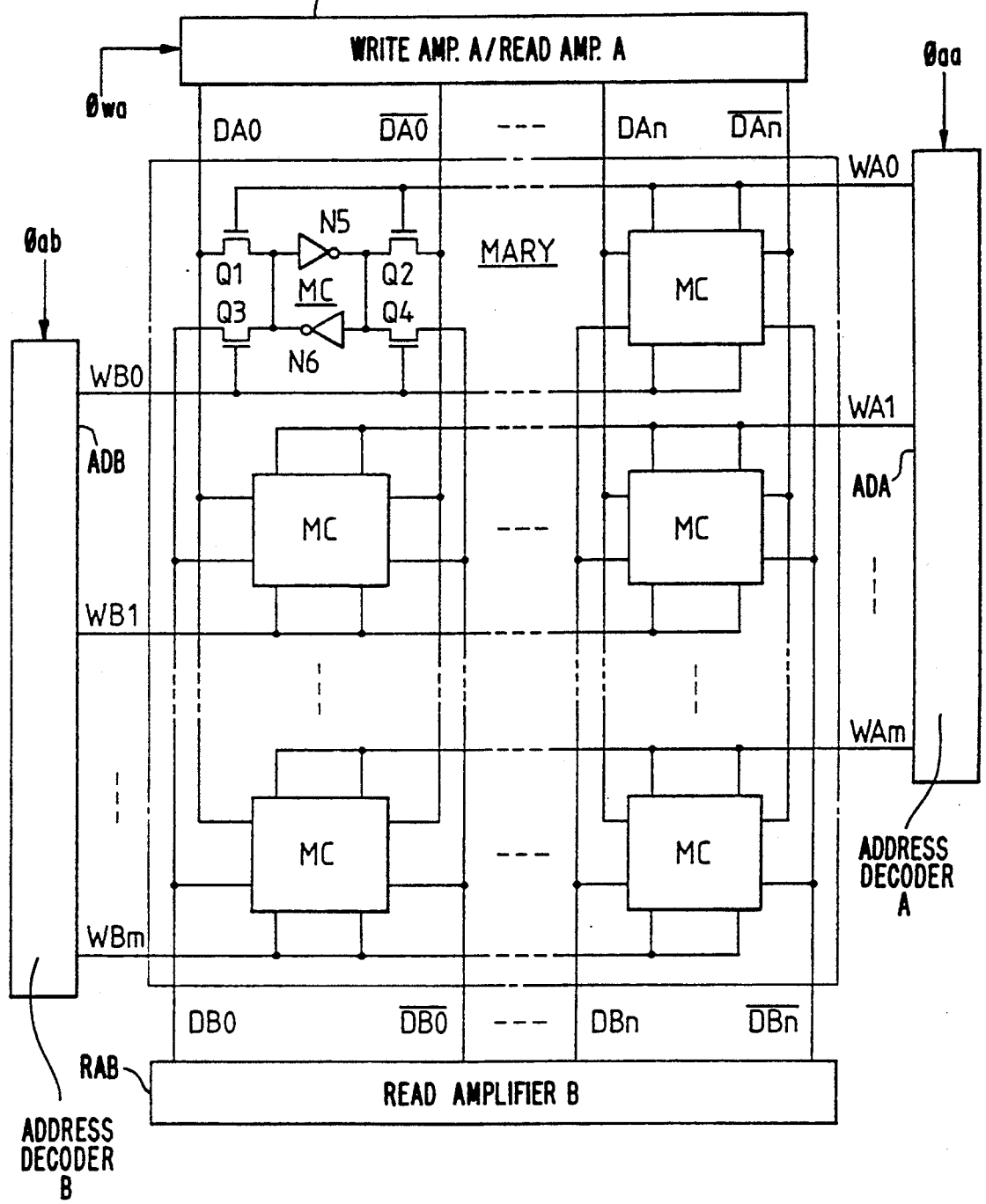
FIG. 4 is a diagram showing an example of a memory array in the multiport memory to which the present invention is applied.

FIG. 4 is a diagram showing an example of the memory array of the multiport memory to which the present invention is applied.

As shown in FIG. 4, the memory array MARY includes the word lines WA0–WAm and WB0–WBm which are arranged in parallel in the horizontal direction and the complementary data lines DA0, $\overline{DA0}$–DAn, $\overline{DAn}$ and DB0, $\overline{DB0}$–DBn, $\overline{DBn}$ which are arranged in parallel in the vertical direction. At the intersection points between the word lines and the complementary data lines, the memory cells MC numbering (m+1)×(n+1) are arranged in the shape of a matrix.

As exemplified in FIG. 4, each of the memory cells MC of the memory array MARY includes two CMOS inverter circuits N5 and N6 the input terminals and output terminals of which are cross-connected to each other. These inverter circuits constitute a latch which serves as the storage element of the memory cell MC.

The input/output nodes of the latches of the (m+1) memory cells MC arranged in the identical column of the memory array MARY are respectively coupled in common to the non-inverted signal line and inverted signal line of the corresponding pair of the complementary data lines DA0, $\overline{DA0}$-DAn, $\overline{DAn}$ through transfer gate MOSFETs Q1 and Q2 of the N-channel type. In addition, they are respectively coupled in common to the non-inverted signal line and inverted signal line of the corresponding pair of the complementary data lines DB0, $\overline{DB0}$-DBn, $\overline{DBn}$ through similar transfer gate MOSFETs Q3 and Q4 of the N-channel type. On the other hand, the gates of the transfer gate MOSFETs Q1, Q2 and Q3, Q4 of the (n+1) memory cells MC arranged in the identical row of the memory array MARY are respectively coupled in common to the corresponding ones of the word lines WA0-WAm and the word lines WB0-WBm.

Thus, the input/output nodes of the latches of the memory cells MC in the identical row are selectively coupled to the complementary data lines DA0, $\overline{DA0}$-DAn, $\overline{DAn}$ corresponding to the memory cells in such a way that one of the word lines WA0-WAm corresponding to the row is selectively brought into the selected state of high level. In addition, they are selectively coupled to the corresponding complementary data lines DB0, $\overline{DB0}$-DBn, $\overline{DBn}$ in such a way that the corresponding one of the word lines WB0-WBm is selectively brought into the selected state of high level.

The word lines WA0-WAm of the memory array MARY are coupled to the address decoder ADA, and they are selectively placed into the selected state of high level. Likewise, the word lines WB0-WBm of the memory array MARY are coupled to the address decoder ADB, and they are selectively placed into the selected state of high level.

Figure 2:
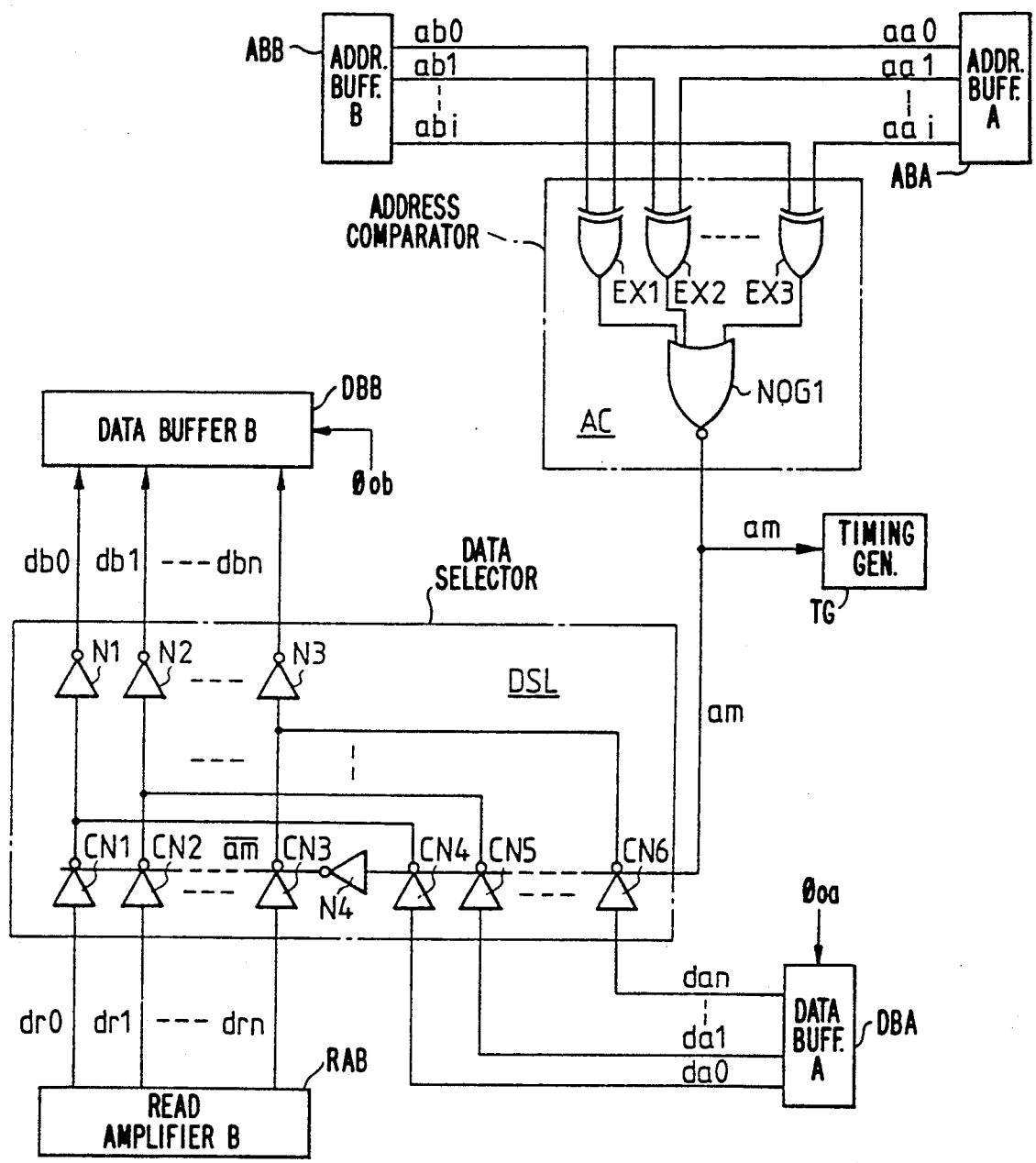
FIG. 2 is a circuit diagram showing an embodiment of an address comparator as well as a data selector in the multiport memory to which the present invention is applied.

FIG. 2 is a circuit diagram showing an embodiment of the address comparator as well as the data selector in the multiport memory to which the present invention is applied.

The address comparator AC includes (i+1) exclusive-OR circuits EX1-EX3, and a NOR gate circuit NOG1 which receives the output signals of the exclusive-OR circuits EX1-EX3. One input terminal of each of the exclusive-OR circuits EX1-EX3 is supplied with the corresponding one of the address signals aa0-aai from the address buffer ABA. Besides, the other input terminal of each of these exclusive-OR circuits is supplied with the corresponding one of the address signals ab0-abi from the address buffer ABB. The output signals of the exclusive-OR circuits EX1-EX3 are respectively supplied to the corresponding input terminals of the NOR gate circuit NOG1. The output signal of the NOR gate circuit NOG1 is supplied to the timing generator TG and the data selector DSL as the output signal of the address comparator AC, namely, the address agreement detection signal am.

Each of the output signals of the exclusive-OR circuits EX1-EX3 of the address comparator AC is set at a high level when the corresponding ones of the address signals aa0-aai and the address signals ab0-abi do not agree. In contrast, it is set at a low level when the corresponding ones of the address signals aa0-aai and the address signals ab0-abi agree.

The output signal of the NOR gate circuit NOG1, namely, the address agreement detection signal am is set at the low level when any of the output signals of the exclusive-OR circuits EX1-EX3 is the high level, in other words, when the address signals aa0-aai and those ab0-abi do not agree even at one bit. The address agreement detection signal am is set at the high level when all the output signals of the exclusive-OR circuits EX1-EX3 are the low level, in other words, when the address signals aa0-aai and those ab0-abi agree at all the bits.

The data selector DSL includes (n+1) clocked inverter circuits CN1-CN3, and (n+1) clocked inverter circuits CN4-CN6 and inverter circuits N1-N3 which are disposed in correspondence with the clocked inverter circuits CN1-CN3.

The input terminals of the clocked inverter circuits CN1-CN3 are respectively used as the input terminals of the data selector DSL on the other side thereof (second input terminals) and are coupled to the output terminals of the corresponding unit circuits of the read amplifier RAB. Likewise, the input terminals of the clocked inverter circuits CN4-CN6 are respectively used as the input terminals of the data selector DSL on one side thereof (first input terminals), and they are respectively coupled in common to the output terminals of the corresponding unit circuits of the read amplifier RAA, namely, the input terminals of the corresponding unit circuits of the write amplifier WAA. The output terminals of the clocked inverter circuits CN1-CN3 are respectively coupled to the output terminals of the corresponding clocked inverter circuits CN4-CN6, and further coupled in common to the input terminals of the corresponding inverter circuits N1-N3. The clock input terminals of all the clocked inverter circuits CN4-CN6 are supplied in common with the above-stated address agreement detection signal am from the address comparator AC. In addition, the clock input terminals of all the clocked inverter circuits CN1-CN3 are supplied in common with the inverted signal of the address agreement detection signal am as produced by an inverter circuit N4, in other words, an inverted address agreement detection signal $\overline{am}$. The output signals of the inverter circuits N1-N3 are used as the read data db0-dbn, and are supplied to the data buffer DBB.

FIG. 3 is a diagram showing an example of the internal arrangement of the timing generator TG.

The timing generator TG has a timing generator circuit TGA for the port A, a timing generator circuit TGB for the port B, a CMOS inverter circuit N7, and a NOR gate circuit NOG2.

When the port A is brought into the selected state, the timing generator circuit TGA for the port A is supplied with the enable signal ENA of high level and the read/write signal R/$\overline{W}$ for setting an operation mode at that time, from the first memory control circuit MCC1. Upon receiving these signals, the timing generator circuit TGA for the port A forms the timing signal $\phi$aa of high level and the timing signals $\phi$oa and $\phi$wa whose level changes in accordance with the operation mode at that time.

When the port B is brought into the selected state, the timing generator circuit TGB for the port B is supplied with the enable signal ENB of high level from the second memory control circuit MCC2. Upon receiving this signal, the timing generator circuit TGB for the port B forms timing signals $\phi'$ab and $\phi$ob of high level.

The timing signal $\phi'$ab is supplied to the input terminal of the CMOS inverter circuit N7. The input terminals of the NOR gate circuit NOG2 are respectively supplied with a timing signal $\overline{\phi'ab}$ which is the output signal of the CMOS inverter circuit N7, and the address agreement detection signal am. Upon receiving these signals, the NOR gate circuit NOG2 forms the timing signal φab.

The timing signal φab is set at the high level when the port B is brought into the selected state, with the address agreement detection signal am being the low level. This timing signal φab, however, is set at the low level when the address agreement detection signal am is the high level in spite of the selected state of the port B. In this case, notwithstanding that the port B is held in the selected state, the word line selecting operation by the address decoder ADB is not executed.

Next, there will be outlined an operation in the case where, in the multiport memory of this embodiment, the individual ports have been brought into the selected states independently.

Referring to FIG. 6, the port A of the multiport memory is brought into the selected state independently of the port B in response to the enable signal ENA being rendered a high level. On this occasion, the operation mode of the port A is selectively set in the write mode or the read mode in accordance with the read/write signal R/$\overline{W}$ as stated before.

When the port A is brought into the selected state as the read mode (with the read/write signal R/$\overline{W}$ set at the high level), the timing signal φaa is first rendered the high level and the timing signal φoa is rendered the high level somewhat later in the multiport memory.

Owing to the timing signal φaa rendered the high level, the operation of selecting any of the word lines WA0-WAm by the address decoder ADA is started. Since one of the word lines WA0-WAm of the memory array MARY is selectively brought into the selected state of high level, the transfer gate MOSFETs Q1 and Q2 of the (n+1) memory cells MC (in FIG. 4) coupled to this word line are simultaneously turned "on", and read signals conforming to the stored data of these memory cells MC are respectively delivered to the complementary data lines DA0, $\overline{DA0}$-DAn, $\overline{DAn}$. The read signals are amplified by the corresponding unit circuits of the read amplifier RAA, and are thereafter transmitted to the data buffer DBA as the read data da0-dan.

Owing to the timing signal φoa being rendered a high level, the data buffer DBA sends the read data Da0φ-Dan to the first memory control circuit MCC1 of the digital processor through the data bus BDA.

On the other hand, when the port A of the multiport memory is brought into the selected state as the write mode (with the read/write signal R/$\overline{W}$ set at the low level), the timing signal φaa is first rendered at a high level and the timing signal φwa is rendered at a high level somewhat later in the multiport memory. The write amplifier WAA is supplied with the write data da0-dan from the data buffer DBA.

Owing to the timing signal φaa being rendered a high level, the address decoder ADA is brought into the operating state, and the operation of selecting any of the word lines WA0-WAm of the memory array MARY is stated as in the read mode. Thus, the corresponding one of the word lines WA0-WAm is selectively brought into the selected state, and the (n+1) memory cells MC coupled to this word line are respectively coupled to the corresponding complementary data lines DA0, $\overline{DA0}$-DAn, $\overline{DAn}$ through the corresponding transfer gate MOSFETs Q1 and Q2.

When the timing signal φwa is set at a high level, the respective unit circuits of the write amplifier WAA form complementary write signals conforming to the transmitted write data da0-dan and transmit them to the complementary data lines DA0, $\overline{DA0}$-DAn, $\overline{DAn}$ of the memory array MARY. Thus, the write data items da0-dan are written into the (n+1) memory cells MC coupled to the selected word line.

Similarly to the foregoing, the port B of the multiport memory is brought into the selected state independently of the port A in response to the enable signal ENB rendered the high level. Then, the port B is set in the read mode. Thus, the timing signals φab and φob are rendered a high level with a predetermined time difference.

Since the timing signal φab is set at a high level, one of the word lines WB0-WBm of the memory array MARY is selectively brought into the selected state, and read signals conforming to the stored data of the (n+1) memory cells MC coupled to this word line are delivered to the corresponding complementary data lines DB0, $\overline{DB0}$-DBn, $\overline{DBn}$. These read signals are amplified by the corresponding unit circuits of the read amplifier RAB, and are transmitted to the input terminals of the data selector DSL on the other side.

Since the port B of the multiport memory is solely held in the selected state, the data selector DSL transmits the read data dr0-drn delivered from the read amplifier RAB of the port B, to the data buffer DBB as the read data db0-dbn.

Owing to the timing signal φob being rendered a high level, the data buffer DBB sends the read data Db0-Dbn to the second memory control circuit MCC2 of the digital processor through the data bus BDB.

As described above, the multiport memory of this embodiment is provided with the two ports A and B which are accessible independently of each other, and the address decoders ADA and ADB are disposed in correspondence with these ports.

Besides, as stated before, the multiport memory of this embodiment is used as the register file of the digital processor such as a computer. Therefore, the ports A and B can be simultaneously brought into the selected states ordinarily according to the system clock of the computer or the like.

Figure 5:
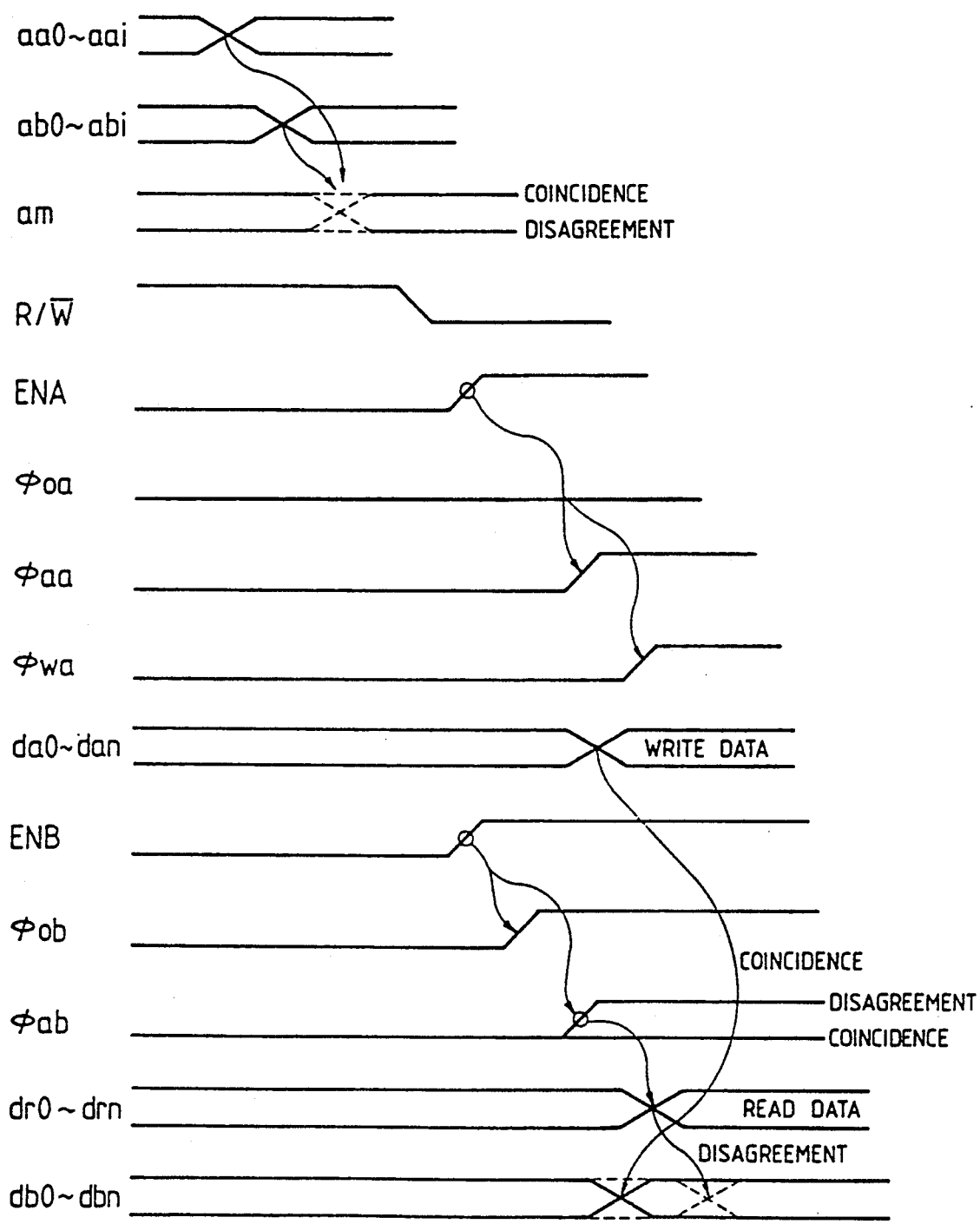
FIG. 5 is a schematic timing chart in the case where ports have been simultaneously brought into selected states.

Here, an example of an operation in the multiport memory of this embodiment will be described with reference to a schematic timing chart of FIG. 5 in the case where both the ports have been simultaneously brought into the selected states.

In response to the enable signal ENA being rendered a high level, the port A of the multiport memory is brought into the selected state. On this occasion, the operation mode of the port A is set in the write mode because the read/write signal R/$\overline{W}$ is at a low level. Likewise, in response to the enable signal ENB being rendered a high level, the port B of the multiport memory is also brought into the selected state. The operation mode of the port B is set in the read mode.

In the port A, after the enable signal ENA has become a high level, the timing signals φaa and φwa are set at a high level in succession. Since the timing signal φoa is rendered a low level, the data buffer DBA supplies the write data da0-dan to the write amplifier WAA and to the input terminals of the data selector DSL on one side thereof (first input terminals).

Since the timing signal φaa is rendered a high level, the address decoder ADA is placed in an operating state so as to start the operation of selecting one of the word lines WA0-WAm of the memory array MARY. Thus, the corresponding one of the word lines WA0-WAm of the memory array MARY is selectively brought into the selected state, and the (n+1) memory cells MC coupled to this word line are respectively coupled to the corresponding complementary data lines DA0, $\overline{DA0}$-DAn, $\overline{DAn}$ through the corresponding transfer gate MOSFETs Q1 and Q2.

When the timing signal $\phi wa$ is set at the high level, the respective unit circuits of the write amplifier WAA form complementary write signals conforming to the write data da0$\phi$dan and transmit them to the complementary data lines DA0, $\overline{DA0}$-DAn, $\overline{DAn}$ of the memory array MARY. Thus, the write data items da0-dan are written into the (n+1) memory cells MC coupled to the selected word line.

Regarding the port B of the multiport memory, after the enable signal ENB has been rendered the high level, the timing signal $\phi ob$, after a predetermined time delay, is set at the high level. The timing signal $\phi ab$ is rendered a high level somewhat later than the timing signal $\phi ob$ when the address signals aa0-aai and ab0-abi supplied to the address comparator AC do not agree, thereby rendering the address agreement detection signal am a low level.

Since the timing signal $\phi ab$ is set at the high level, one of the word lines WB0-WBm of the memory array MARY is selectively brought into the selected state, and read signals conforming to the stored data of the (n+1) memory cells MC coupled to this word line are delivered to the corresponding complementary data lines DB0, $\overline{DB0}$-DBn, $\overline{DBn}$. These read signals are amplified by the corresponding unit circuits of the read amplifier RAB, and are transmitted to the input terminals of the data selector DSL on the other side thereof (second input terminals).

The data selector DSL transmits the read data dr0-drn transmitted from the read amplifier RAB of the port B, to the data buffer DBB as the read data db0-dbn for the port B.

In contrast, the timing signal $\phi ab$ is maintained at a low level state when the address signals aa0-aai and ab0-abi supplied to the address comparator AC agree, since the address agreement detection signal am is rendered a high level. At that time the data selector DSL transmits the write data da0-dan, supplied to the data selector DSL directly from the data buffer DBA of the port A through a separate data path (e.g., separate data bus) which bypasses the memory array, to the data buffer DBB as the read data db0-dbn from the port B. As a result therefore, electrical signal transfer of write data is isolated from complementary data lines and thus from the memory cells of the memory array MARY. On this occasion, although not particularly limited thereto, only the write operation is performed in the port A, and the word line selecting operation by the address decoder ADB of the port B and the amplifying operation by the read amplifier RAB thereof are inhibited.

In response to the timing signal $\phi ob$ being rendered a high level, the data buffer DBB sends the read data Db0-Dbn to the second memory control circuit MCC2 of the digital processor through the data bus BDB.

As described above, the address signals aa0-aai and ab0-abi which are supplied through the corresponding ports are respectively supplied to the corresponding address decoders, and they are also supplied to the address comparator AC so as to be compared and checked bit by bit. When, as a result of such comparison, both of the address signals agree at all the bits, the address agreement detection signal (or address coincidence comparison signal) am is selectively set at the high level. Between the read amplifier RAB of the port B and the corresponding data buffer DBB, there is interposed the data selector DSL whose input terminals on the other side (second input terminals) receive the read data dr0-drn delivered from the read amplifier RAB of the port B and whose input terminals on one side (first input terminals) receive the write data da0-dan delivered from the data buffer DBA of the port A or the read data da0-dan delivered from the read amplifier RAA thereof. In a case where the port A is brought into the selected state as the write mode at the same time the port B is brought into the selected state as the read mode and, moreover, where the addresses which are input to both of the ports agree, so that the address agreement detection signal am is rendered a high level, the data selector DSL selects the write data da0-dan of port A as the read data db0-dbn for the port B and transmits them to the data buffer DBB. That is, the write data items da0-dan received from the port A are delivered as the read data of the port B without passing through the selected memory cells MC of the memory array MARY. Therefore, even in the case where the ports A and B have been simultaneously set in the selected states as the write mode and the read mode, respectively, and where the addresses designated by both the ports are in agreement, the read data corresponding to the latest write data is delivered to the port B at a timing similar to that of the ordinary read operation. Thus, the access time of the multiport memory is effectively shortened, and the throughput capability of the digital processor including the multiport memory is further enhanced.

As indicated in the foregoing embodiments, in a case where the present invention is applied to a semiconductor memory, such as multiport memory, which is built in a gate array integrated circuit or the like, the following effects are attained:

(1) The multiport memory is provided with a data selector by which, when addresses designated by at least two ports agree and one port is set in a write mode, while the other port is set in a read mode, write data supplied from one port is directly transmitted to the output circuit of the other port through a path which bypasses the memory array and reading amplifier associated therewith. That is, there is produced the effect that the write data supplied from one port can be delivered as the read data of the other port without passing through the selected memory cells of a memory array when the addresses of the multiport memory are in agreement.

(2) Owing to the above item (1), even in the case where the addresses which are input to the plurality of ports agree and where one port is set in the write mode, while the other port is set in the read mode, the read operation of the multiport memory can be rendered as fast as the ordinary read operation thereof. Accordingly, there is produced the effect that the access time of the multiport memory can effectively be shortened, that is reduced artificially.

(3) Owing to the above items (1) and (2), there is produced the effect that the operating speed of a digital processor including the multiport memory can be improved thereby further enhancing the throughput capability thereof.

Although, in the above, the invention has been specifically described in conjunction with the accompanying embodiments, it is needless to say that the present invention is not restricted to the foregoing embodiments, but that it can be exemplified by other embodiments and variations thereof that are within the spirit and scope of the appended claims. By way of example, in the block diagram of FIG. 6, both of the ports A and B may well be set as input/output ports each being capable of a write operation and a read operation. Alternatively, the port A may be implemented as a write-only port and the port B as a read-only port. Moreover, the multiport memory may well have three or more ports. Although, in the embodiments, only the word lines can be selected, a column address-group selector may well be disposed to permit also the complementary data line of the memory array MARY to be selected. The memory array MARY may well be configured as a plurality of memory mats, where each mat corresponds to an arrangement of memory arrays, and the practicable arrangement of the memory cells MC is not restricted to the embodiment shown in FIG. 4. Moreover, the memory array MARY in which the static memory cells MC are arranged in the matrix shape may well be replaced with an array in which standard flip-flops are arranged in the matrix shape. In FIG. 2, the address comparator AC may well be constructed by combining standard logical gate circuits without employing the exclusive-OR circuits stated before, if the address signals aa0–aai and ab0–abi are complementary signals. Similarly, the data selector DSL may well be constructed by combining standard logical gate circuits instead of the clocked inverter circuits. Further, the practicable circuit arrangements of the address comparator AC, data selector DSL and memory array MARY illustrated in FIGS. 2 and 4 can be implemented in various other forms, and the block arrangement of the multiport memory and the combination of the address signals, control signals etc. as illustrated in FIG. 6 can be appropriately configured to perform various operations.

Figure 7:
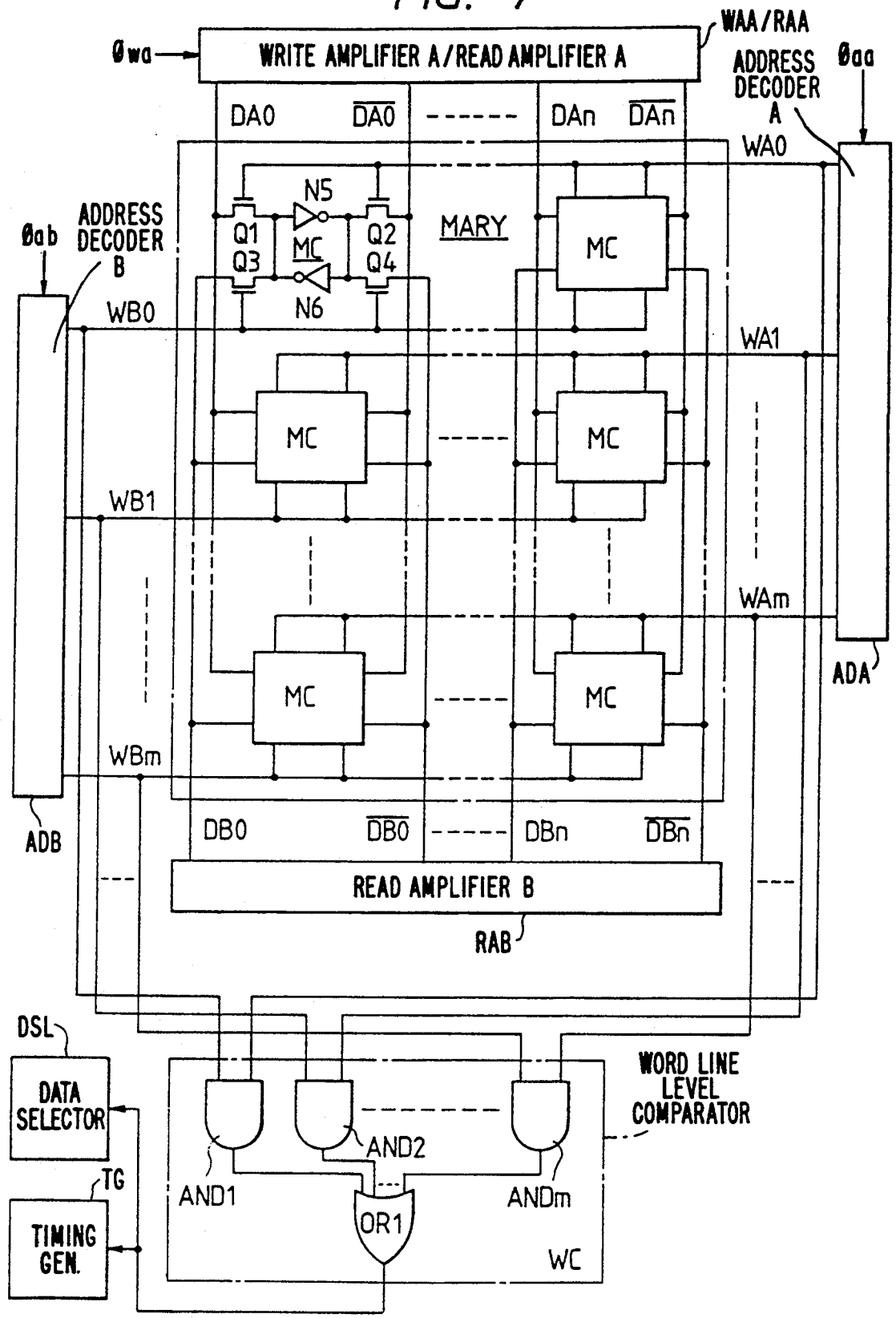
FIG. 7 is a diagram showing another embodiment in the present invention.

In addition, the present invention is not restricted to the method in which the address signals are compared for the agreement detection as explained in the embodiments, but it may well adopt a method in which the level of a selected word line is detected as illustrated in FIG. 7. By way of example, a word line level comparator WC in this figure includes 2-input AND gate circuits AND1-ANDm each of which has the corresponding one of word lines WAi (i=0, 1, . . . m) coupled to one input terminal thereof and has the corresponding one of word lines WBj (j=0, 1, . . . m) coupled to the other input terminal thereof, and an OR gate circuit OR1 which receives the output signals of all the 2-input AND gate circuits AND1-ANDm. The output signal of the OR gate circuit OR1 is supplied to the data selector DSL and the timing generator TG as explained in the previous embodiments.

In the above, the invention has been chiefly described in connection with application to a multiport memory built in a gate array integrated circuit with respect to a field of utilization. However, the invention is not restricted thereto, but it is also applicable to, for example, a multiport memory which is solely formed as such and similarly to multiport memories which are built in various other digital integrated circuits. The present invention can be extensively applied to a semiconductor memory which has, at least, a plurality of ports independently accessible at will or to a digital processor, e.g., a single-chip microcomputer in which such a semiconductor memory is built.

An effect which is attained by a typical aspect of performance of the present invention is briefly explained as follows: A multiport memory is furnished with a data selector according to which, when addresses which are input to a plurality of ports agree and one port and the other port are respectively set in a write mode and a read mode, write data supplied from one port is directly transmitted as read data for the other port, whereby the read operation of the multiport memory in such a case can be rendered as fast as the ordinary read operation thereof, so that the access time of the multiport memory can be shortened for all practical purposes. Thus, the operating speed of a digital processor including the multiport memory can be improved thereby further enhancing the throughput capability thereof.

What is claimed is:

1. A microcomputer comprising an arithmetic logic unit and a memory unit coupled to said arithmetic logic unit through internal buses, wherein said microcomputer is formed on a single semicomputer substrate, said memory unit comprising:

memory means for storing data including a plurality of memory cells, a plurality of first and second word lines, and a plurality of pairs of data lines, wherein each of said plurality of memory cells is respectively coupled to a first word line, a second word line and a pair of data lines;

write means, coupled with said plurality of pairs of data lines, for writing write data, provided from said arithmetic logic unit, into selected ones of said plurality of memory cells;

first decoder means for selecting one of said plurality of first word lines in accordance with first address signals supplied at inputs thereof;

second decoder means for selecting one of said plurality of second word lines in accordance with second address signals supplied at inputs thereof;

comparing means having inputs coupled to receive said first and second address signals and for outputting a coincidence signal when there is coincidence between the first and second address signals;

bypass means for transferring said write data as read data without said write data passing through said plurality of pairs of data lines thereby bypassing said memory means; and data output means having inputs coupled to receive read data, corresponding to data read from said memory means, and said write data from said bypass means and having a control input, wherein said data output means outputs said write data when said coincidence signal is provided to said control input.

2. A microcomputer according to claim 1, wherein each of said plurality of memory cells includes a flip-flop circuit comprised of MOSFETs.

3. A microcomputer according to claim 2, wherein each flip-flop circuit includes a pair of CMOS inverters having cross-coupled input and output terminals.

4. A microcomputer according to claim 1, wherein said data input means includes a plurality of clocked inverters each of said plurality of clocked inverters has an input, an output and a control terminal, and said plurality of clocked inverters are divided into first and second groups of clocked inverters in which the inputs thereof are coupled to receive said write data and said read data, respectively, and in which the control terminals thereof are coupled to receive said coincidence signal and its logical complement, respectively.

5. A microcomputer according to claim 4, wherein said data output means further includes a data buffer having inputs commonly coupled to receive write data outputted from said clocked inverters of said first group or read data outputted from said clocked inverters of said second group.

6. A microcomputer comprising an arithmetic logic unit and a memory coupled to said arithmetic logic unit, wherein the microcomputer is formed on a single semiconductor chip, said memory comprising:

memory means for storing data including a memory array having memory cell, a plurality of first word lines and a plurality of second word lines, a plurality of pairs of data lines and write means for providing potentials, in accordance with write data receive from said arithmetic logic unit, to said pairs of data lines, wherein each of said memory cells is coupled to a first word line, a second word line and a pair of data lines;

first means for selecting one of said plurality of first word lines in accordance with first address signals supplied at inputs thereof, wherein when said one first word line is selected, the memory cells coupled thereto are supplied with write data, through said write means, from said arithmetic logic unit;

second means for selecting one of said plurality of second word lines in accordance with second address signals supplied at inputs thereof, wherein when said one second word line is selected, the memory cell coupled thereto supply read data;

comparing means having inputs coupled to receive said first and second address signals and an output for outputting a coincidence signal when there is coincidence between the first and second address signals;

bypass means for transferring said write data as read data to respective inputs of third means, said bypass means being electrically isolated from said plurality of pairs of data lines and said plurality of memory cells; and wherein said third means has separate inputs coupled to receive read data corresponding to data read from said memory array and the write data from said bypass means, respectively, said third means having a control input coupled to the output of said comparing means for receiving said coincidence signal, and said third means in response to said coincidence signal at said control input outputting said write data as read data.

7. A microcomputer according to claim 6, wherein said third means includes a data select circuit of at least one clocked inverter having a control terminal coupled to receive said coincidence signal.

8. A microcomputer according to claim 6, wherein said third means comprises a data select circuit including a plurality of clock inverters, each of said plurality of clocked inverters has an input, an output and a control terminal, and said plurality of clocked inverters are divided into first and second groups of clocked inverters in which the inputs thereof are coupled to receive said write data and said read data, respectively, and in which the control terminals thereof are coupled to receive said coincidence signal and its logical complement, respectively.

9. A microcomputer according to claim 6, wherein said first address signals are write address signals and said second address signals are read address signals.

10. A microcomputer according to claim 9, wherein each of said memory cells includes a flip-flop circuit comprised of MOSFETs.

* * * * *